(12) United States Patent
Wu et al.

(10) Patent No.: US 11,366,392 B2
(45) Date of Patent: Jun. 21, 2022

(54) PHOTORESIST REMOVER COMPOSITIONS

(71) Applicant: Merck Patent GmbH, Darmstadt (DE)

(72) Inventors: Hengpeng Wu, Hillsborough, NJ (US); Guanyang Lin, Whitehouse Station, NJ (US)

(73) Assignee: Merck Patent GmbH, Darmstadt (DE)

(*) Notice: Subject to any disclaimer, the term of this patent is extended or adjusted under 35 U.S.C. 154(b) by 0 days.

(21) Appl. No.: 16/961,818

(22) PCT Filed: Jan. 23, 2020

(86) PCT No.: PCT/EP2019/051533
§ 371 (c)(1),
(2) Date: Jul. 13, 2020

(87) PCT Pub. No.: WO2019/145311
PCT Pub. Date: Aug. 1, 2019

(65) Prior Publication Data
US 2021/0080833 A1      Mar. 18, 2021

Related U.S. Application Data

(60) Provisional application No. 62/621,743, filed on Jan. 25, 2018.

(51) Int. Cl.
*C11D 7/34*       (2006.01)
*G03F 7/42*       (2006.01)
*C11D 3/34*       (2006.01)
*C11D 3/43*       (2006.01)

(52) U.S. Cl.
CPC ........... *G03F 7/426* (2013.01); *C11D 3/3418* (2013.01); *C11D 3/43* (2013.01)

(58) Field of Classification Search
CPC .................................................. C11D 11/0047
USPC ........................................................ 510/175
See application file for complete search history.

(56) References Cited

U.S. PATENT DOCUMENTS

| | | | | |
|---|---|---|---|---|
| 2006/0293208 A1* | 12/2006 | Egbe | ............. | G03F 7/425 510/407 |
| 2007/0272275 A1* | 11/2007 | Wu | ............. | G03F 7/426 134/19 |
| 2012/0073610 A1* | 3/2012 | Kamimura | ........ | H01L 21/02071 134/26 |
| 2015/0252302 A1* | 9/2015 | Rieth | ............. | A61Q 5/10 514/772 |
| 2017/0200619 A1* | 7/2017 | Cooper | ............. | C11D 7/22 |
| 2018/0074408 A1* | 3/2018 | Moore | ............. | C11D 11/0047 |

(Continued)

FOREIGN PATENT DOCUMENTS

| JP | H01 114846 A | 5/1989 |
|---|---|---|
| JP | 2006 011433 A | 1/2006 |

(Continued)

OTHER PUBLICATIONS

PCT International Search Report and Opinion, PCT/EP2019/015133, dated Apr. 1, 2019.

(Continued)

*Primary Examiner* — Gregory E Webb
(74) *Attorney, Agent, or Firm* — Francis M. Houlihan

(57) ABSTRACT

The present invention relates to a composition consisting essentially of an alkylbenzenesulfonic acid having structure (I) (wherein n is an integer from 0 to 16); a solvent which is either selected from the group consisting of solvents having structures (II), (wherein R is selected from the group consisting of —(O—CH$_2$—CH$_2$—)$_{n'}$—OH, —OH, —O—C(=O)—CH$_3$, wherein n' is equal to 1, 2, 3, or 4), a solvent having structure (III), a solvent having structure (IV), and a solvent having structure (V), or a solvent mixture, of at least two solvents selected from this group. In another embodiment, the composition also consists of, additionally, a surfactant component. This invention also relates to using either of these compositions to remove a patterned photoresist from a substrate.

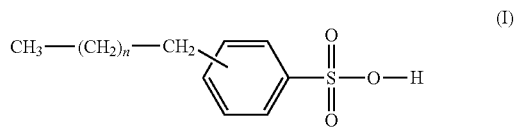

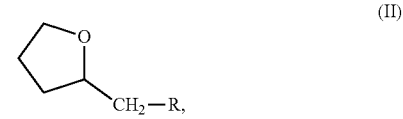

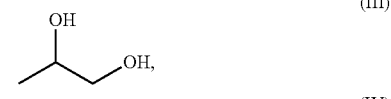

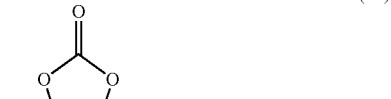

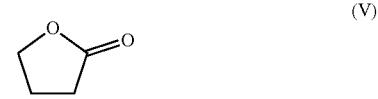

24 Claims, No Drawings

(56) References Cited

U.S. PATENT DOCUMENTS

| | | | |
|---|---|---|---|
| 2018/0272386 A1* | 9/2018 | McAlpin | C11D 7/263 |
| 2019/0016999 A1* | 1/2019 | Sakamuri | C11D 3/0073 |
| 2021/0080833 A1* | 3/2021 | Wu | G03F 7/426 |
| 2021/0115362 A1* | 4/2021 | Arent | C11D 11/0047 |

FOREIGN PATENT DOCUMENTS

| | | |
|---|---|---|
| JP | 2006 332082 A2 | 12/2006 |
| KR | 2003 0069688 A | 8/2003 |
| WO | 1991 31191 A1 | 6/1999 |
| WO | 2000 23406 A1 | 4/2000 |
| WO | 2001 00763 A1 | 1/2001 |
| WO | 2016 142507 A1 | 9/2016 |
| WO | 2019 145311 A | 8/2019 |

OTHER PUBLICATIONS

PCT International Search Report and Opinion, PCT/EP2019/051534, dated Mar. 27, 2019.

Quillen, M., et al. "Optimizing surface finishing processes through the use of novel solvents and systems.", Proceedings of Spie. Downloaded from http://www.spiedigitallibrary.org/conference-proceedings-of-spie (Oct. 17, 2017).

Wallis, Christopher, et al. "Effect of water and lipophilic alcohols or amines on the 4-dodecylbenzenesulfonic acid-catalysed esterifications, trans-esterifications and amidations." European Journal of Lipid Scientific Technology (2017) 119, 1600483.

* cited by examiner

PHOTORESIST REMOVER COMPOSITIONS

This application is a United States National Stage Patent Application under 35 U.S.C. § 371 of International Patent Application No. PCT/EP2019/051533, filed Jan. 23, 2019, which claims priority to U.S. Provisional Patent Application No. 62/621,743, filed Jan. 25, 2018, the contents of each of which are being hereby incorporated herein by reference.

FIELD OF INVENTION

The present invention relates to compositions of a low pKa remover solution consisting of specific alkylbenzenesulfonic acids and specific solvents, and also composition containing these two components and a surfactant. These remover solutions show clean removal of photoresist patterns from substrates, showing complete dissolution of the removed resist pattern with no particle formation or deposition. Further, when the substrate is a metal such as copper, additionally, the removal of the patterned resist does not cause significant corrosion of metal substrates.

BACKGROUND

This invention relates to a chemical stripper composition that removes cross-linked polymer coatings using novel remover compositions which do not promote corrosion of metal substrates, but which unexpectedly also do not require the presence of metal protecting chelating compounds or compound or polymers of charge complexing character to prevent significant corrosion.

Materials removed by these novel formulations include positive tone and negative-tone chemically amplified (e.g. epoxy) and acid-catalyzed photoimageable coatings. Many commercialized strippers for microelectronic coatings do not perform sufficiently to meet minimum manufacturing requirements. The invention provides a commercial framework to create removal products for cross-linked systems that respond in acidic media without the harmful etching and damaging effects commonly observed on devices that contain metals such as copper, but at the same time do not contain metal chelating compound that may deleteriously form particulate matter during the removing/stripping process.

For various processed conditions, up to and including hard-baking, or otherwise referred to as full-cure, the composition will remove and dissolve chemically-amplified reacted compounds within minutes without damaging effects to sensitive metals such as copper, using conventional immersion conditions at elevated temperatures. Such full-cure coatings are found to be resistant to conventional organic strippers that commonly comprise alkaline ingredients as exemplified in U.S. Pat. No. 6,551,973 (2003), Moore et al. Using these conventional strippers, no dissolution occurs. Instead, these conventional alkaline strippers are observed to remove the coating by mechanisms of lifting or breaking-up into pieces. This lift-off mechanism generates incomplete removal from complex three dimensional topographies as commonly seen in microelectromechanical systems (MEMS) devices. Un-dissolved material will produce particles that are circulated throughout the bath, causing re-deposition of the un-dissolved pieces onto other areas of the device. Such contamination that occurs onto these tiny, computer controlled, gears, sensors, springs, pumps, and related micro or nano-scale fixtures results in contamination and device failure. It is an object of this invention to achieve full-dissolving of the unwanted polymer material during the given stripping and removal period.

Some low pKa systems that remove crosslinked coatings, do so by complete dissolution, rather than lift-off, however, these materials contain metal corrosion inhibitors, which unexpectedly, causes a particulate problem, due to the precipitation of these inhibitor components during the removal process. These corrosion inhibitors are metal complexing additives which are added to prevent corrosion of metal substrates, by the low pKa remover by complexing with metal substrates during the removal process. One examples of such corrosion inhibitors, are small molecules, oligomers or polymers containing a moiety of the enol variety, for instance, containing an unsaturated carbon chain adjacent to alcohol functionality. Representative enol inhibitors include fumaric, maleic, and phthalic acid. More specific examples of inhibitors are those of the rosin variety; these are, for instance fumarated rosins. The particles formed by metal inhibitor in low pKa removers, may deposit unto other areas of the device, deleteriously affecting the performance of the final device. A non-limiting example of such low pKa remover systems containing such metal inhibitors is described in WO2016/142507.

During the manufacture of these microcircuits or microdevices, various inorganic substrates such as single and polycrystalline silicon, hybrid semiconductors such as gallium arsenide, and metals, are coated with an organic coating ("photoresist", or resist) which forms a resistant framework of permanent or temporary design and exhibits a pattern after undergoing a photolithographic process. The photoresist may be utilized to insulate conductors or protect selected areas of the substrate surface, such as silicon, silicon dioxide, or aluminum, from the action of chemicals in both wet (chemical) and dry (plasma) forms. In the case of the material being utilized as a photoresist, exposed areas of the substrate may carry out a desired etch (removal) or deposition (addition) process. Following completion of this operation and after subsequent rinsing or conditioning, it is necessary that the resist and any application post-etch residue be removed to permit essential finishing operations. Upon removal of the photoresist, specific micro-etched or deposited patterns are left behind. The masking and patterning processes are repeated several times to produce layered arrangements that comprise the art of the final device. Each step requires complete resist stripping and dissolving, to ensure that the final form device is produced at relatively high yields and performs satisfactorily. The deposition of any particles during this process into active area deleteriously affects both the yield and performance of devices.

It is an object of this invention to provide an improved stripping composition that will remove a wide range of different pattered photoresist film including, ones formed from different types of both negative and positive resist systems. Of these different types, examples are resists which are imageable by visible light, broadband i-line, g-line, h-line, UV, 248 nm, 193 nm, 193 nm immersion, deep UV, EUV, electron or e-beam. Depending of which type is employed these materials may contain additives such as photo-active compounds (e.g. DNQ), photo-acid generators (PAG), and photoradical generators which may be prone to particle formation. Consequently, it is also an objective that our invention be able to remove patterns formed from these types of resist, giving complete dissolution in minutes, rather than hours of all components, resins and additives, without particle formation. It is also an object of this invention to conduct such photoresist removal from substrates without attack to underlying exposed copper as well as other metals without the use of metal corrosion inhibitor additives, as such additives may be prone to also promote particle formation during the removal of the resist pattern. It is a further object to conduct this photoresist pattern removal and metal protection by utilizing a safe and non-regulated chemistry that does not produce harm to workers or to the environment and avoiding the use of solvents with low flash point, especially those whose boiling points are below about 150° C.

The current novel remover compositions, impart these advantageous properties by completely dissolving the photoresist pattern, from patterns from many different types of resist, not forming lifted-off resist film, or particles resulting from either resins or additives using safe non-regulated solvents whose boiling points above 150° C. At the same time, unexpectedly, these novel remover composition, while containing a low pKa component, an alkylbenzenesulfonic acid component, do not require the presence of any inhibitor additive to suppress significant corrosion of metal substrate such as copper and the like. Consequently, there is no problem associated with the precipitation of metal corrosion inhibitor during the removal process using these novel compositions. These novel remover compositions and process of use thereof have been found to be especially useful in the manufacture of semiconductor wafers, MEMS devices, and displays.

SUMMARY OF THE INVENTION

In one of its aspects, the present invention relates to a composition consisting essentially of an alkylbenzenesulfonic acid having structure (I), wherein n is an integer from 0 to 16;

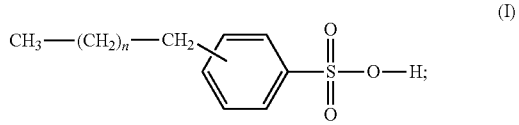

(I)

and
a solvent which is either selected from the group consisting of solvents having structures (II), (wherein R is selected from the group consisting of —(—O—CH$_2$—CH$_2$—)$_{n'}$—OH, —OH, —O—C(=O)—CH$_3$, wherein n' is equal to 1, 2, 3, or 4), a solvent having structure (III), a solvent having structure (IV), and a solvent having structure (V), or a solvent mixture, of at least two solvents selected from this group;

(II)

(III)

(IV)

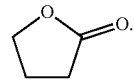

(V)

In another embodiment, this composition also, additionally, consist essentially of, a surfactant component. Finally, this invention also relates to using either above compositions to remove a patterned photoresist from a substrate.

DETAILED DESCRIPTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The term (meth)acrylate is a term which embodies in one term both acrylate and methacrylate.

The term "stripper," and "remover," are synonymous.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

When referring to compositions in terms of wt % it is understood that in no event shall the wt % of all components, including non-essential components, such as impurities, add to more than 100 wt %. The composition of all essential components may add up to less than 100 wt % in those instances wherein the composition contains some small amount of a non-essential contaminants or impurities. Otherwise, if no significant non-essential impurity component is present, it is understood that the composition of all essential components will essentially add up to 100 wt %.

The expression "consisting essentially of" has the meaning that the constituents form at least 90 wt %, more preferably at least 95 wt %, most preferably at least 99 wt % of the composition.

The term "essentially" is intended to mean that no further components similar to the listed components are present in the composition. For example, when the composition is defined by the presence of an alkylbenzenesulfonic acid and specific solvents, preferably no additional other alkylbenzenesulfonic acids and solvents are present in the composition. When for the composition alkylbenzenesulfonic acid, solvent and surfactant are defined as essential components, preferably no additional alkylbenzenesulfonic acids, solvents or surfactants (of a specified type) are employed. Therefore, when the surfactant is defined as corresponding to structure (VI) or (VIa), preferably no further surfactants different from the structures are present in the composition.

According to one embodiment of the invention, the term "consisting essentially of" can be replaced by "consisting of", thereby allowing for no further components in the composition.

The present invention relates to a composition consisting essentially of an alkylbenzenesulfonic acid having structure (I), wherein n is an integer from 0 to 16, a solvent which is either selected from the group consisting of solvents having structures (II), (wherein R is selected from the group consisting of —(—O—CH$_2$—CH$_2$—)$_{n'}$—OH, —OH, —O—C(=O)—CH$_3$, wherein n' is equal to 1, 2, 3, or 4), a solvent having structure (III), a solvent having structure (IV), and a solvent having structure (V), or a solvent mixture, of at least two solvents selected from this group;

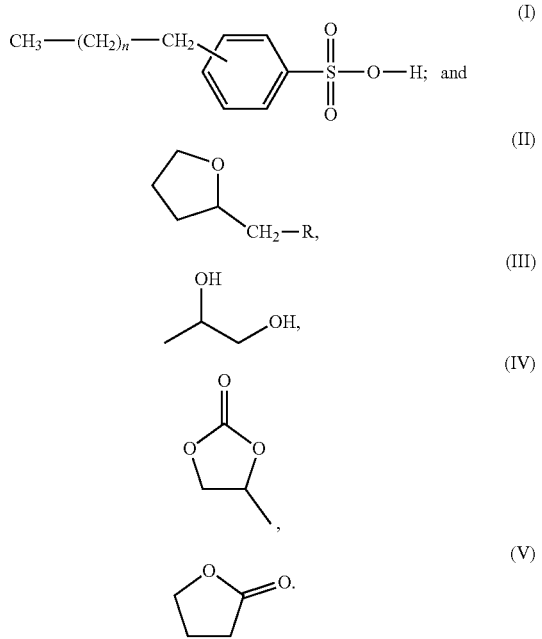

In another embodiment, this invention relates to a composition consisting essentially of an alkylbenzenesulfonic acid selected having structure (I), wherein n is an integer from 0 to 16, a solvent which is either selected from the group consisting of solvents having structures (II), (wherein R is selected from the group consisting of —(—O—CH$_2$—CH$_2$—)$_{n'}$—OH, —OH, —O—C(=O)—CH$_3$, wherein n' is equal to 1, 2, 3, or 4), a solvent having structure (III), a solvent having structure (IV), and a solvent having structure (V), or a solvent mixture, of at least two solvents selected from this group, and a surfactant.

In the above embodiments containing surfactant, there is no particular restriction with regard to the surfactant, and the examples of it include a polyoxyethylene alkyl ether such as polyoxyethylene lauryl ether, decaethylene glycol monododecyl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.).

In another embodiment of the aforementioned inventive compositions, is wherein, the surfactant is present in an amount that is less than 1 wt % of the total weight of the composition. In another embodiment, the surfactant is present in an amount that is less than 0.1 wt %.

In another embodiment of any of the above aspect of the above inventive composition, the composition is one, wherein the surfactant is a polymeric surfactant having structure (VI), wherein n''' is the number of polymer repeat unit and na is the number of CH$_2$ spacer moieties, which is an integer from 8 to 14. In another embodiment of this aspect of the composition said polymeric surfactant has structure (VIa).

In embodiments of this invention containing a surfactants having structure (VI) or (VIa) each may individually be present in the composition from about 0.005 wt % to about 0.100 wt %. In another embodiment from about 0.010 wt % to about 0.050 wt %. In yet another embodiment from about 0.015 wt % to about 0.040 wt %. In still another embodiment from about 0.020 wt % to about 0.035 wt %. In yet another embodiment from about 0.022 wt % to about 0.030 wt %. In still another embodiment from about 0.023 wt % to about 0.028 wt %. In yet another embodiment from about 0.024 wt % to about 0.026 wt %. In still another embodiment about 0.025 wt %.

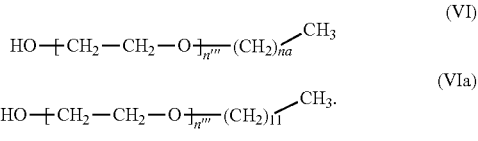

In another embodiment of any of the above aspect of the above inventive composition is one wherein for said alkylbenzenesulfonic acid of structure (I), n is an integer from 8 to 16. In another aspect of this embodiment the composition is one wherein for said alkylbenzenesulfonic acid n is an integer from 8 to 14. In yet another embodiment of this aspect, the alkylbenzenesulfonic acid is one wherein n is an integer from 8 to 10.

In another embodiment of any of the above aspect of the above inventive composition is one wherein for said alkylbenzenesulfonic acid is one wherein it has structure (Ia).

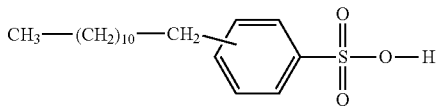

(Ia)

In another embodiment of the above inventive composition is one, which, in said alkylbenzenesulfonic acid of structure (I), n is an integer from 0 to 10. In another aspect of this embodiment, n is an integer from 0 to 5. In yet another embodiment of this aspect, n is an integer from 0 to 2. In another aspect of this embodiment said alkylbenzenesulfonic acid has structure (Ib).

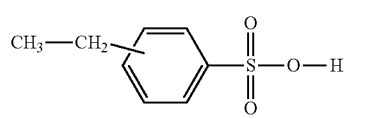

(Ib)

In another embodiment of the above aspect of this composition, wherein the alkylbenzensulfonic acid it has structure (I), where n is an integer from 0 to 16, this acid has the more specific structure (Ic), wherein nb is an integer from 0 to 16. In a more specific aspect of this embodiment nb is an integer from 10 to 14. In yet another aspect of this embodiment nb is an integer from 8 to 10. In still another embodiment of this aspect it has the more specific structure (Id).

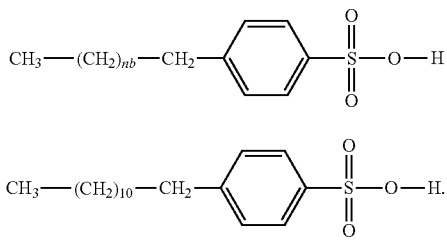

(Ic)

(Id)

In another embodiment of the any of the above aspect of this composition, wherein the alkylbenzensulfonic acid has the more specific structure (Ic), in a more specific embodiment, nb is an integer from 0 to 10. In still another aspect of this embodiment, nb is an integer from 0 to 5. In yet another embodiment of this aspect, this acid has the more specific structure (Ie).

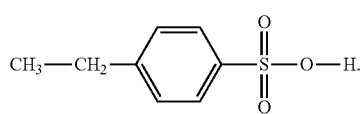

(Ie)

In another embodiment of any of the above aspects of this composition, the alkylbenzenesulfonic acid component, having structure (I) has a wt % loading in the total wt of the solution ranging from about 1 wt % to about 10 wt %. In another aspect of this embodiment the wt % loading of this acid is from about 2 wt % to about 8 wt %. In another aspect of this embodiment the wt % loading of this acid is from about 3 wt % to about 7 wt %. In another aspect of this embodiment the wt % is from about 4 wt % to about 6 wt %. In another aspect of this embodiment the wt % is about 5 wt %. In another aspect of any of the above composition ranges, the alkenesulfonic acid is one having structure (I) wherein, n is an integer from 8 to 16. In another aspect n is an integer from 8 to 14. In yet another aspect, n is an integer from 8 to 10. In any of the above described ranges, the alkylbenzenesulfonic acid is one having structure Ia.

In another embodiment of any of the above aspects of this composition, the alkylbenzenesulfonic acid component, having structure (Ic) has a wt % loading in the total wt of the solution ranging from about 1 wt % to about 10 wt %. In another aspect of this embodiment the wt % loading of this acid is from about 2 wt % to about 8 wt %. In another aspect of this embodiment the wt % loading of this acid is from about 3 wt % to about 7 wt %. In another aspect of this embodiment the wt % is from about 4 wt % to about 6 wt %. In another aspect of this embodiment the wt % is about 5 wt %. In another aspect of any of the above composition ranges, the alkenesulfonic acid is one having structure (Ic) wherein, nb is an integer from 8 to 16. In another aspect nb is an integer from 8 to 14. In yet another aspect, nb is an integer from 8 to 10. In any of the above described ranges, the alkylbenzenesulfonic acid is one having structure Ic.

In another embodiment of any of the above aspects of this composition, the alkylbenzenesulfonic acid component, having structure (I) has a wt % loading in the total wt of the solution ranging from about 1 wt % to about 10 wt %. In another aspect of this embodiment the wt % loading of this acid is from about 1 wt % to about 6 wt %. In another aspect of this embodiment the wt % loading of this acid is from about 1 wt % to about 5 wt %. In another aspect of this embodiment the wt % is from about 1 wt % to about 3 wt %. In another aspect of this embodiment the wt % is from about 2 wt % to about 3 wt %. In another aspect of this embodiment the wt % is about 2.67 wt %. In another aspect of this embodiment, n is an integer from 0 to 5. In yet another aspect of this aspect, n is an integer from 0 to 2. In yet another embodiment of this aspect, n is an integer from 0 to 1. In another aspect of this embodiment said alkylbenzenesulfonic acid has structure (Ib).

In another embodiment of any of the above aspects of this composition, the alkylbenzenesulfonic acid component, having structure (Ic) has a wt % loading in the total wt of the solution ranging from about 1 wt % to about 10 wt %. In another aspect of this embodiment the wt % loading of this acid is from about 1 wt % to about 6 wt %. In another aspect of this embodiment the wt % loading of this acid is from about 1 wt % to about 5 wt %. In another aspect of this embodiment the wt % is from about 1 wt % to about 3 wt %. In another aspect of this embodiment the wt % is from about 2 wt % to about 3 wt %. In another aspect of this embodiment the wt % is about 2.67 wt %. In another aspect of any of the above composition ranges, the alkenesulfonic acid is one having structure (Ic), wherein nb is an integer from 0 to 10. In another aspect of this embodiment, nb is an integer from 0 to 5. In yet another embodiment of this aspect, nb is an integer from 0 to 2. In yet another embodiment of this aspect, nb is an integer from 0 to 1. In another aspect of this embodiment said alkylbenzenesulfonic acid has structure (Ie).

The solvent embodied by structures (II), (III), (IV), and (V), all have boiling points at atmospheric pressure above 150° C. More specifically, they have boiling point above about 160° C. at atmospheric pressure. For instance, one of the aspects of structure (II), Tetraglycol (Tetrahydrofurfuryl diethylene glycol ether) has a predicted boiling point at atmospheric pressure of 302.7° C. Similarly, other compounds falling within the scope of structure (II), Tetrahydrofurfuryl alcohol and tetrahydrofurfuryl acetate, respectively, have boiling points at atmospheric pressure of 178° C. and 193° C. The compound corresponding to structure (III), 1,2-propylene glycol, has a boiling point of 188.2° C. The compound corresponding to structure (IV), 1,2-propylene carbonate, has a boiling point of 242° C. Finally, the compound corresponding to structure (V), dihydro-2(3H)-Furanone, has a boiling point of 204° C.

In another embodiment of the any of the above aspect of this composition, said solvent is a single solvent which has a structure falling within the scope of structures (II), as previously defined.

In another embodiment of the any of the above aspect of this composition, said solvent is a mixture of at least two different solvents whose structures are ones falling within the scope of structures (II), as previously defined.

In another embodiment of the any of the above aspect of this composition, said solvent is one which has structure (IIa), wherein n' is 1, 2, 3 or 4.

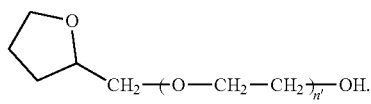

(IIa)

In another embodiment of the any of the above aspect of this composition, said solvent is a mixture of at least two solvents having structure (IIa) having different values of n' 1, 2, 3, or 4.

In another embodiment of the any of the above aspect of this composition, said solvent is one which has structure (IIb).

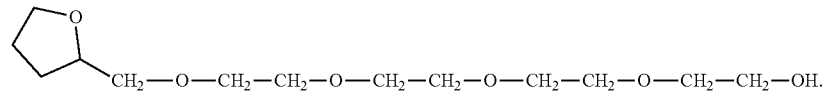

(IIb)

In another embodiment of the above described compositions, said solvent has structure (IIc).

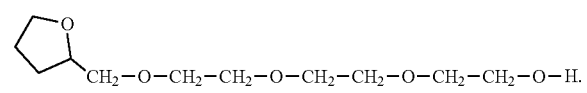

(IIc)

In another embodiment of the above described compositions, said solvent has structure (IId).

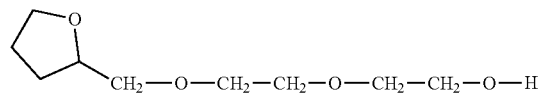

(IId)

In another embodiment of the above described compositions, said solvent has structure (IIe).

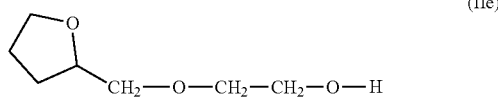

(IIe)

In another embodiment of the above described compositions, said solvent has structure (IIf).

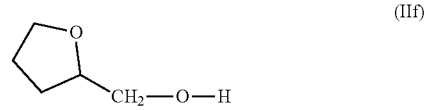

(IIf)

In another embodiment of the above described compositions, said solvent has structure (IIg).

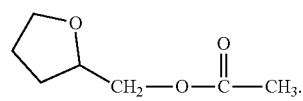

(IIg)

In another embodiment of the above described compositions, said solvent has structure (III).

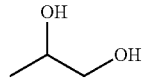

(III)

In another embodiment of the above described compositions, said solvent has structure (IV).

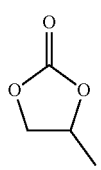

(IV)

In another embodiment of the above described compositions, said solvent has structure (V).

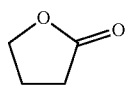

In the above embodiments of the novel composition, wherein the solvent component is a mixture of at least two solvents selected from ones having structures (II), structure (III), structure (IV) and structure (V) non-limiting examples of possible embodiments are as follows:

Binary, tertiary or greater mixtures of solvent either selected from the structures embodied by structure (II), mixtures of any of these solvents having the structures embodied in structure (II) with any of the solvents having structures (III), (IV), or (V) or mixtures of the solvents having structures (III), (IV) or (V).

One embodiment of specific mixtures are mixtures of different solvent having general structure (IIa) with different values of n'. Non-limiting examples of this aspect of the invention are, for instance, quaternary mixtures of (IIb), (IIc), (IId), and (IIe); tertiary mixtures of (IIc), (IId) and (IIe), or (IIb), (IIc) and (IIe), or (IIb), (IId) and (IIe), and the like; binary mixtures of (IIb) and (IIc), or (IIb) and (IId), or (IIb) and (IIe), or (IIc) and (IId), or (IIc) and (IIe), or (IId) and (IIe). Mixtures of different solvents having structure (IIa) as described above, may also be combined with at least one solvent selected from the group consisting of solvents having structures (IIf), (IIg), (III), (IV), and (V).

Individual solvents having the different structures embodied by structure (IIa), having different values of n', may also be combined with at least one other solvent selected from the group consisting of ones having structures (IIf), (IIg), (III), (IV), and (V).

Another embodiment of possible solvent mixtures are binary mixtures of the solvent having structure WO with another selected from the group consisting of ones having structures (IIg), (III), (IV), and (V).

Another embodiment of possible solvent mixtures are binary mixtures of the solvent having structure (IIg) with another selected from the group consisting of ones having structures (III), (IV), and (V).

Another embodiment of possible solvent mixtures are binary mixtures of the solvent having structure (III) with another selected from the group consisting of ones having structures (IV), and (V).

Another embodiment of possible solvent mixtures is the binary mixture of the solvent having structure (IV) with the one having structures (V).

Another embodiment of possible solvent mixtures are mixtures of the above binary solvent mixtures with at least one additional different solvent selected from the group consisting of ones having structures (IIb), (IIc), (IId), (IIe), (IIf), (IIg), (III), (IV), and (V).

Another embodiment of this invention is a process comprising the steps;
i) heating any one of the above described compositions at a temperature which is from about room temperature to about 100° C.;
ii) dipping a substrate coated with a patterned photoresist film into said heated composition for a time from about 1 minutes to about 60 minutes, until, a dipped substrate with a removed photoresist film, results;
iii) after dipping step ii), rinsing said dipped substrate with a removed photoresist film with either isopropyl alcohol, water or a mixture of isopropyl alcohol and water to remove any residual composition from dipping step ii), producing a clean substrate;
iv) drying said clean substrate, by either spin drying it in air, or by using a stream of nitrogen or air to dry it.

In another embodiment of the above inventive process, it is one, wherein in step i), the composition is heated from about 60° C. to about 100° C.

In another embodiment of the above inventive process, it is one, wherein in step ii), the substrate is a metal. In one aspect of this embodiment the metal is selected from Aluminum, Aluminum/copper alloys, Copper, Titanium, Tungsten and Nickel. In another aspect of this embodiment of the process, the metal is selected from Aluminum, Aluminum/copper alloys, and copper. In still another embodiment of the above inventive process, it is one, wherein in step ii), the substrate is copper.

In another embodiment of the above inventive process, it is one, wherein in step ii), the substrate is dipped from about 1 minute to about 5 minutes.

In another embodiment of the above inventive process, it is one, wherein in step iii) the rinse is done with water.

The novel remover composition may be used in the above inventive process to remove patterns from many different types of photoresist patterns, which are as follows:

The novel remover may be used to remove patterned resist films having a variety of thicknesses depending on the application, IC devices, IC devices interconnect, circuit board, solder board application, MEM, display and the like. Typically, the thickness tracts with the size of the device being manufactured starting from about tens of nanometers for state of the art IC, to the several microns range for larger IC devices, to 10 to 500 microns for very large devices such as MEM's.

The removers of the present disclosure can be used with resist pattern which arise from negative and positive photoresist material capable of forming patterns which may be selected from ones which may form patterns using different types of radiation. For instance, as non-limiting examples resist patterns for removal may be formed from i-line photoresists, g-line photoresists 248 nm photoresists, 193 nm photoresist, Extreme Ultraviolet photoresists, electron beam photoresists and particle beam photoresists. The removers of the present disclosure can be used with photoresist patterns may arise from photoresists which may be further classified as follows by the type of chemistry which is employed to obtain the pattern.

For instance, the removers of the present disclosure may be used to remove positive pattern resulting from, exposure by visible, i-line, h-line, and g-line and development by aqueous base employ of photoresists based upon a Novolak resin and a diazonaphthoquinone type sensitizer (DNQ) sensitizer material, these types of resist system may also yield negative images through a tone reversal process. Diazonapthoquinone Novolak based resists are described in (Diazonaphthoquinone-based Resists, Chapter 2, Basic Chemistry of DNQ/Novolak resists, SPIE Optional Engineering Press volume TT 11, page 9, 1993), which are hereby incorporated by reference in its entirety.

The removers of the present disclosure can be used to remove resist patterns resulting from both negative or positive photoresist which are chemically amplified and aqueous base developable. Typically, resist patterns are formed by 248 nm, 193 nm, EUV to enable higher resolutions patterns, but resist patterns may also be produced using longer wavelengths, such as visible, broadband UV, i-line, g-line, and h-line.

The removers of the present disclosure can be used to remove resist patterns resulting from positive tone chemically amplified resists, resins which are latently aqueous base soluble, such as (meth)acrylate copolymers, styrenic copolymer, Novolaks, phenolic resins, are rendered aqueous base soluble by deprotecting acid cleavable group which mask aqueous base solubilizing moieties. The base solubilizing moieties may be carboxylic acids, phenols, or other moieties having typically a pKa below 11 such that aqueous base will largely ionize them. The acid is generated in exposed areas of the photoresist film by a photoacid generating compound. This acid deprotects the acid cleavable group through a process of acidolysis, or hydrolysis, releasing a free base solubilizing moieties, allowing, in exposed areas for the photoresist film to be aqueous base soluble.

The removers of the present disclosure can be used to remove resist patterns resulting from negative tone chemically amplified, whose inherent aqueous base solubility is not masked by any protecting group. Rather, in this approach, an inherently base soluble resin (binder resin) such as ones based on aqueous base soluble (meth)acrylate copolymers, styrenic copolymer, Novolaks, and the like are crosslinked catalytically by photo-acid through acid crosslinking moieties. These moieties may be pendent to the binder resins themselves, present on crosslinking additives (crosslinking agents) or present on both the resins and the additives. Acid catalyzed crosslinking in exposed areas is affected through a photo-acid generated by a PAG, which results, after aqueous base development in a negative tone image. Typically, when a crosslinking additive is employed it is a moiety capable of forming a carbonium ion upon interaction with the photoacid such as an aminoplast, or an additive containing acid crosslinkable group such as an epoxy compound. Similarly, if the crosslinking moiety is present on the resin it may either be a moiety capable of forming a carbonium ion with acid, or a moiety which can undergo crosslinking with an acid such as an epoxy moiety. The following reference is a review of chemically amplified resist: (H. Ito, Adv Polym Sci 2005 172 p 37).

The removers of the present disclosure can be used to remove resist patterns resulting from negative chemically amplified resist may result from negative chemically amplified resists, where the binder resins may comprise a novolak, for instance ones derived from a substituted phenol such as ortho-cresol; meta-cresol; para-cresol; 2,4-xylenol; 2,5-xylenol; 3,4-xylenol, 3,5-xylenol, thymol and mixtures thereof, that has been condensed with an aldehyde such as formaldehyde. In other approaches, the binder resin may also comprise a poly(vinyl phenol) such as a poly(para-hydroxystyrene); a poly(para-hydroxy-alpha-methylstyrene; a copolymer of para-hydroxystyrene or para-hydroxy-alpha-methylstyrene and styrene, acetoxystyrene or acrylic acid and/or methacrylic acid; a hydroxyphenylalkyl carbinol homopolymer; or a novolak/poly(vinyl phenol) copolymer. The crosslinking additives, for such negative chemically amplified resist, may be etherified aminoplast crosslinking functionalities containing within a small compound, an organic oligomer, or a polymer. Such aminoplasts, provide a carbonium ion, upon acid cleavage, and serves to crosslink the binder resin in the presence of an acid generated by radiation, preferably imaging radiation. This crosslinking renders the binder resin insoluble in an alkaline medium, in the exposed areas. Such crosslinking agents may be prepared from a variety of aminoplasts in combination with a compound or low molecular weight polymer containing a plurality of hydroxyl, carboxyl, amide or imide groups. Some examples of amino oligomers or polymers are aminoplasts obtained by the reaction of an amine, such as urea, melamine, or glycoluro with an aldehyde, such as formaldehyde. Suitable aminoplasts may include urea-formaldehyde, melamine-formaldehyde, benzoguanamine-formaldehyde, and gylcoluril-formaldehyde resins, and combinations of any of these. In some applications, the aminoplast is a hexa(methoxymethyl) melamine oligomer. A non-limiting example of such materials is described in U.S. Pat. No. 6,576,394.

The removers of the present disclosure can be used with negative resist patterns for use with the novel low pKa remover compositions and processes described above, may result from negative crosslinking resists which are based upon crosslinking initiated by a photoradical generator, instead of a photoacid generator. In this instance, the same type of binder resins may be employed as described above for the chemically amplified negative photoresists. However, in this instance a crosslinking additive is present which comprises at least two olefinic moiety, which is easily susceptible to radical crosslinking. Examples of such moieties are, vinyl aryl moieties such as styrenes, and acrylate or methacrylate moieties. Non-limiting, more specific examples of these radical crosslinking additive can be appropriately selected, depending on the purposes, from acrylic acid derivatives such as acrylic acid esters and methacrylic acid derivatives such as methacrylic acid esters. These may have a low molecular weight (monomer property) or a high molecular weight (oligomer or polymer property). In this instance, the additive may be small molecule, an oligomer or a polymer which contain multiple radical crosslinkable moieties. Some of these radical crosslinking additives may have structures within them which are acid cleavable. Such structures may be of use during further processing of the patterned film, for instance in facilitating stripping of the resist after pattern transfer into the substrate. Examples of such acid cleavable groups are tertiary ethers, tertiary carboxylates, and the like which are susceptible to acidolytic cleavage without advantageous water, or alternatively acid cleavable moieties which may readily undergo complete hydrolytic cleavage with photo-acid advantageous water in the resist film such as acetal, ketals, and alkyl silyl ethers. A non-limiting example of such materials is described in U.S. Pat. No. 7,601,482.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

Chemicals

DBSA (dodecylbenzenesulfonic acid; CAS: 68584-22-5) was obtained from Stepan (22 West Frontage Rd., Northfield, Ill. 60093). All other chemicals were purchased from Sigma Aldrich (3050 Spruce St., St. Louis, Mo. 63103).

Processing

Silicon 200 mm (8") wafers with 150 nm copper sputter coating were used for metal corrosion testing. A copper coated silicon wafer coupon was immersed in a preheated photoresist remover solution for a time of periods that were more than enough to strip a photoresist. Regular inspection was done to check the condition of the metal surface by visual and microscopic inspection for the presence of surface haze as indicative of corrosion. Surface haze can be identified and confirmed at levels more sensitive than gravimetric analysis (<10 Å/min).

For photoresist stripping tests, unless otherwise stated, silicon wafers with 150 nm sputtered copper were used as the substrate upon which a chemically amplified negative photoresist AZ-15nXT (a product of EMD Performance Materials, Branchburg, N.J. 08876) was applied and processed. The processing consisted of spin coating the resist to a 12 μm thickness and applying a soft bake on a hotplate at 110° C. for 180 sec. The resist was then exposed to 900 mJ/cm2 of light through a contact hole patterned mask. A post-exposure bake was completed on a hotplate at 120° C. for 60 seconds before developing the resist. Development used AZ 300 MIF Developer in two puddles of 60 seconds each followed by a rinse with DI water.

Copper Corrosion and Photoresist Stripping Test 1

A photoresist remover solution was prepared by dissolving 5 wt % DBSA in 1,2-propanediol (CAS: 57-55-6). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 2

A photoresist remover solution was prepared by dissolving 5 wt % DBSA in tetrahydrofurfuryl alcohol (CAS: 97-99-4). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 3

A photoresist remover solution was prepared by dissolving 5 wt % DBSA in propylene carbonate (CAS: 108-32-7). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 4

A photoresist remover solution was prepared by dissolving 5 wt % DBSA in γ-butyrolactone (CAS: 96-48-0). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 5

A photoresist remover solution was prepared by dissolving 5 wt % DBSA in tetrahydrofurfuryl acetate (CAS: 637-64-9). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 6

A photoresist remover solution was prepared by dissolving 5 wt % DBSA in tetraglycol (CAS: 31692-85-0). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further, the substrate was free of any particles after rinsed with DI water for 1 min and blown dry with a nitrogen gun.

Copper Corrosion and Photoresist Stripping Test 7

A photoresist remover solution was prepared by dissolving 5 wt % DBSA and 250 ppm of the surfactant decaethylene glycol mono-dodecyl ether (CAS: 9002-92-0) in tetraglycol (CAS: 31692-85-0). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 8

A photoresist remover solution was prepared by dissolving 5 wt % 4-ethylbenezenesulfonic acid (CAS: 98-69-1) in tetraglycol (CAS: 31692-85-0). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 9

A photoresist remover solution was prepared by dissolving 2.67 wt % 4-ethylbenezenesulfonic acid (CAS: 98-69-1) in tetraglycol (CAS: 31692-85-0). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 10

A photoresist remover solution was prepared by dissolving 5 wt % 4-ethylbenezenesulfonic acid (CAS: 98-69-1) in tetrahydrofurfuryl alcohol (CAS: 97-99-4). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 11

A photoresist remover solution was prepared by dissolving 2.67 wt % 4-ethylbenezenesulfonic acid (CAS: 98-69-1) in tetrahydrofurfuryl alcohol (CAS: 97-99-4). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 12

A photoresist remover solution was prepared by dissolving 5 wt % DBSA in a mixture (1:1 by weight) of tetraglycol (CAS: 31692-85-0) and tetrahydrofurfuryl alcohol (CAS: 97-99-4). The solution was heated on a hotplate to 65° C. in a 150-mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 13

A photoresist remover solution was prepared by dissolving 1 wt % DBSA in tetraglycol (CAS: 31692-85-0). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 14

A photoresist remover solution was prepared by dissolving 10 wt % DBSA in tetraglycol (CAS: 31692-85-0). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 15

A photoresist remover solution was prepared by dissolving 1 wt % 4-ethylbenezenesulfonic acid (CAS: 98-69-1) in tetraglycol (CAS: 31692-85-0). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

Copper Corrosion and Photoresist Stripping Test 16

A photoresist remover solution was prepared by dissolving 10 wt % 4-ethylbenezenesulfonic acid (CAS: 98-69-1) in tetraglycol (CAS: 31692-85-0). The solution was heated on a hotplate to 65° C. in a 150 mL beaker with a magnetic stirring bar (200 rpm). The copper wafer coupon was immersed in the heated solution for 30 min and rinsed with DI water for 1 min and blown dry with a nitrogen gun. The copper surface was free of haze and essentially intact by visual and microscopic inspections. Further the substrate was also free of any particles.

The same composition, temperature and setup were used to remove photoimaged AZ-15 nXT photoresist patterns. The crosslinked photoresist patterns were completely dissolved within 5 min. Further the substrate was free of any particles after rinsed with DI water for 1 min and blown dry with a nitrogen gun.

The above tests 1-16 have demonstrated that a strong alkylbenzenesulfonic acid (e.g., DBSA) having an alkyl group containing at least 2 carbons, without anti-corrosion agents prevents significant corrosion of copper when formulated in chosen solvents, as outlined above, and the compositions were effective to strip a chemically amplified negative photoresist.

Comparative Copper Corrosion Test 1

A photoresist remover solution was prepared by dissolving 5 wt % DBSA in di(propylene glycol) monomethyl ether (CAS: 34590-94-8). The solution was heated on a hotplate to 65° C. in a 150 mL beaker with a magnetic stirring bar (200 rpm). The copper wafer coupon was immersed in the heated solution. After 3 min, all copper layer on silicon wafer was completely removed.

Comparative Copper Corrosion Test 2

A photoresist remover solution was prepared by dissolving 5 wt % DBSA in γ-valerolactone (CAS: 108-29-2). The solution was heated on a hotplate to 65° C. in a 150 mL beaker with a magnetic stirring bar (200 rpm). The copper wafer coupon was immersed in the heated solution. After 1 min, the copper surface of the wafer coupon turned hazy and after 10 min all the copper layer was completely removed.

Comparative Copper Corrosion Test 3

A photoresist remover solution was prepared by dissolving 5 wt % DBSA in 3-methoxy-3-methyl-1-butanol (CAS: 56539-66-3). The solution was heated on a hotplate to 65° C. in a 150 mL beaker with a magnetic stirring bar (200 rpm). The copper wafer coupon was immersed in the heated solution. After 5 min, the copper surface of the wafer coupon turned hazy.

Comparative Copper Corrosion Test 4

A photoresist remover solution was prepared by dissolving 5 wt % DBSA in DMSO (CAS: 67-68-5). The solution was heated on a hotplate to 65° C. in a 150 mL beaker with a magnetic stirring bar (200 rpm). The copper wafer coupon was immersed in the heated solution. After 10 min, the copper surface of the wafer coupon turned hazy.

Comparative Copper Corrosion Test 5

A photoresist remover solution was prepared by dissolving 5 wt % DBSA in methylpyrrolidone (CAS: 872-50-4). The solution was heated on a hotplate to 65° C. in a 150 mL beaker with a magnetic stirring bar (200 rpm). The copper wafer coupon was immersed in the heated solution. After 3 min, the copper surface of the wafer coupon turned hazy.

Comparative Copper Corrosion Test 6

A photoresist remover solution was prepared by dissolving 5 wt % DBSA in 1-octanol (CAS: 111-87-5). The solution was heated on a hotplate to 65° C. in a 150 mL beaker with a magnetic stirring bar (200 rpm). The copper wafer coupon was immersed in the heated solution. After 10 min, the copper surface of the wafer coupon turned hazy.

Comparative Copper Corrosion Test 7

A photoresist remover solution was prepared by dissolving 4 wt % p-toluenesulfonic acid (CAS: 6192-52-5) in propylene carbonate (CAS: 108-32-7). The solution was heated on a hotplate to 65° C. in a 150 mL beaker with a magnetic stirring bar (200 rpm). The copper wafer coupon was immersed in the heated solution. After 5 min, the copper surface of the wafer coupon turned hazy.

Comparative Copper Corrosion Test 8

A photoresist remover solution was prepared by dissolving 4 wt % camphor-10-sulfonic acid (CAS: 5872-08-2) in tetrahydrofurfuryl alcohol (CAS: 97-99-4). The solution was heated on a hotplate to 65° C. in a 150 mL beaker with a magnetic stirring bar (200 rpm). The copper wafer coupon was immersed in the heated solution. After 15 min, the copper surface of the wafer coupon turned hazy.

Comparative Rinsing Test 1

A photoresist remover solution was prepared by dissolving 5 wt % DBSA and 5 wt % Rosin (fumaric modified rosin ester, Filters 591, Later, Inc.) in tetrahydrofurfuryl alcohol (CAS: 97-99-4). The solution was heated on a hotplate to 65° C. in a 150 mL beaker with a magnetic stirring bar (200 rpm). A copper wafer coupon with photoimaged AZ-15 nXT photoresist patterns was dipped in the heated solution. After 5 min, the coupon was taken out and rinsed with DI water. Many particles remained on the wafer coupon.

Comparative Rinsing Test 2

A photoresist remover solution was prepared by dissolving 5 wt % DBSA in tetrahydrofurfuryl alcohol (CAS: 97-99-4). The solution was heated on a hotplate to 65° C. in a 150 mL beaker with a magnetic stirring bar (200 rpm). A copper wafer coupon with photoimaged AZ-15 nXT photoresist patterns was dipped in the heated solution. After 5 min, the coupon was taken out and rinsed with DI water. Wafer coupon surface was clean without any particles.

The above comparative examples showed that the alkylbenzenesulfonic acid component of this novel composition when formulated in different solvents other than those of the inventive composition will unexpectedly give significant copper. Also, this unexpected result is very specific to the acid used, as other sulfonic acid such as camphor sulfonic acid, or even the closely similar toluene sulfonic acid, having a methyl substituent, (a.k.a. a C1 alkyl), even when formulated in these same chosen solvents as outlined above corrodes copper. Thus, the unexpected suppression of significant corrosion, only occurs when a specific combination of n-alkyl-substituted benzenesulfonic acid and solvents is employed.

The following additional examples showed that the novel photoresist remover compositions also have acceptable etch rate with resists on other substrates and also gave effective removal of photoresist patterns formed by different types of photoresists.

Additional Photoresist Stripping Test 1

A photoresist remover solution was prepared by dissolving 5 wt % DBSA and 250 ppm decaethylene glycol mono-dodecyl ether (CAS: 9002-92-0) in tetraglycol (CAS: 31692-85-0). Using a hot plate 150 mL of the solution was heated to 40° C. in a 250 mL beaker with a magnetic stirring bar (200 rpm). A wafer coupon with patterned AZ nLOF 5510 resist (a negative-tone cross-linked resist product of EMD Performance Materials, Branchburg, N.J. 08876) was immersed in the solution. After 1 minute the nLOF 5510 resist was dissolved off the surface of the coupon. Exposed metal layers of Al, Cu, and Ti were not etched or pitted.

Additional Photoresist Stripping Test 2

A photoresist remover solution was prepared by dissolving 5 wt % DBSA and 250 ppm decaethylene glycol mono-dodecyl ether (CAS: 9002-92-0) in tetraglycol (CAS: 31692-85-0). Using a hot plate 150 mL of the solution was heated to 60° C. in a 250 mL beaker with a magnetic stirring bar (200 rpm). A wafer coupon with patterned AZ nLOF 2035 resist (a negative-tone cross-linked resist product of EMD Performance Materials, Branchburg, N.J. 08876) was immersed in the solution. After 20 minutes the nLOF 2035 lifted and dissolved in the solution. Exposed metal layers of Al and Ti were not etched or pitted.

Additional Photoresist Stripping Test 3

A photoresist remover solution was prepared by dissolving 5 wt % DBSA and 250 ppm decaethylene glycol mono-dodecyl ether (CAS: 9002-92-0) in tetraglycol (CAS: 31692-85-0). Using a hot plate 150 mL of the solution was heated to 65° C. in a 250 mL beaker with a magnetic stirring bar (200 rpm). A wafer coupon with patterned Shipley SPR-220 resist (a positive-tone DNQ/Novolac resist) was immersed in the solution. After 10 minutes the Shipley SPR-220 lifted and dissolved in the solution. The exposed materials (Al, TiW, benzocyclobutene (BIB)) were not etched or pitted.

Additional Metal Etch Rate Tests 1

A photoresist remover solution was prepared by dissolving 5 wt % DBSA and 250 ppm decaethylene glycol mono-dodecyl ether (CAS: 9002-92-0) in tetraglycol (CAS: 31692-85-0). Using a hot plate 200 mL of the solution was heated to 80° C. in a 250 mL beaker with a magnetic stirring bar (300 rpm). Wafer coupons with a blanket layer of various metals were immersed in the solution for 30 and 60 minutes. Film thicknesses of the metal layers were measured using a Jandel 4 Point Probe. Film thicknesses were measured at times of 0 (before immersion), 30 minutes, and 60 minutes. Plots were made of film thickness vs. time. A linear regression was made to the data. The slope of the linear regression is the measured etch rate value as shown in the following table (Table 1). The results showed that the photoresist remover composition has low etch on various metals except on Sn.

TABLE 1

| | Film (Etch Rates in Å/min) | | | | | | | |
|---|---|---|---|---|---|---|---|---|
| Temp (° C.) | Al (0.5% Cu) | Cu | Ti | W | TiW | TiN | Sn | Ni |
| 80 | <1 | 3 | <1 | <1 | <1 | 2 | 75 | <1 |

Unexpectedly, it has been found that certain specific n-alkylbenzenesulfonic acids having alkyl groups greater than at least two carbons, when combined with certain specific solvents of structures (II), (III), (IV) and (IV), impart to remover compositions the ability to completely dissolve a wide variety of resist patterns without either the formation of particles, or significant corrosion of metal substrates.

It has also been found that unexpectedly, then even solvent mixtures of these solvents and these same n-alkylbenzenesulfonic acids also unexpectedly impart these desirable remover properties.

A wide range of n-alkylsulfonic acid component (I), may be present in the formulation while still retaining these desirable remover properties.

Although not bound by theory, it is possible that n-alkylbenzenesulfonic acid which have surfactant properties, in certain solvent that can unexpectedly lead to the formation of micelle like structures only in these specific solvents. The formation of such micellar structure may play a role in preventing significant corrosion of metal substrate during the removal process. Specifically, under this hypothesis, these structures would self-assemble in micellar structures, wherein the sulfonic acid moieties tied to the benzene ring are inside the micellar structure surrounded by the non-polar alkyl chain tied to these benzene rings. Thus, these types of micellar structures, may hinder the deleterious interaction of the sulfonic acid groups of the alkylbenzenesulfonic acid, with relatively polar metal surfaces, preventing significant corrosion, while still allowing these micelles to interact with the relatively hydrophobic resist patterns to dissolve them during the removal process. Some support for this possibility may be found in that the calculated surface tension of a 1 wt % solution of different 4-alkylbenzenesulfonic acid (Molecular Modeling Pro Plus Version 7.0.8, Montgomery Software Inc) appear to show a consistent lowering of the surface tension of water. Pure water has a surface tension of 75.64 dyn/cm while a 1 wt % solution of n-alkylbenzene sulfonic acids (ethyl or greater chain length) have a calculated surface tension of 27.3 to about 28.5 dyn/cm, depending on the chain length of the alkyl group on the benzene ring (Table 2). Camphorsulfonic acid and toluenesulfonic acid (alkylbenzenesulfonic acid with methyl alkyl), using the same calculation, do not have any surface tension lowering ability (Table 2). These calculations support the hypothesis that while alkylbenzenesulfonic acid having chain length longer than 1 carbon may possibly, unexpectedly form protective micellar structures only in certain solvent (a.k.a. (II) to (V)). This has no potential of happening with camphor sulfonic acid and toluene sulfonic acid because these sulfonic acids have no surfactant properties. This said, if this is true, this behavior may be highly predicated on a specific unexpected combination of n-alkylbenzenesulfonic acids with specific solvent, as it has been found that even minor deviations in the choice of structure solvent will cause these acids to cause corrosion of metal substrates (Comparative Copper Corrosion Test 1 to 8.).

Finally, the problem of undesirable particle formation when using a metal inhibitor compound in a remover formulation containing an n-alkylbenzenesulfonic acid is shown in "Comparative Rinsing Test 1," wherein the use of 5 wt % Rosin causes pronounced formation of particles after removal of the resist pattern. In contrast in "Comparative Rinsing Test 2," it is shown that omitting this inhibitor component, while still using the solvent tetrahydrofurfuryl alcohol, one of the solvents falling under structure (II), having structure (IIe), still affects complete dissolution of the resist pattern, while still not corroding the copper substrate, and additionally not forming the deleterious particles seen in "Comparative Rinsing Test 1," containing the additional metal inhibitor compounds.

TABLE 2

| Sulfonic acid | Surface tension in 1% water dynes/cm2 |
| --- | --- |
| Camphorsulfonic acid | no surfactant properties |
| Toluenesulfonic acid (4-methylbenzenesulfonic acid) | no surfactant properties |
| 4-Ethylbenzenesufonic acid | 27.33 |
| 4-Propylbenzenesulfonic acid | 27.46 |
| 4-Butylbenzenesulfonic acid | 27.58 |
| 4-Pentylbenzenesulfonic acid | 27.69 |
| 4-Hexylbenzenesulfonic acid | 27.79 |
| 4-Heptylbenzenesulfonic acid | 27.89 |
| 4-Octylbenzenesulfonic acid | 27.98 |
| 4-Nonylbenzenesulfonic acid | 28.06 |
| 4-Decylbenzenesultonic acid | 28.14 |
| 4-Undecylbenzenesulfonic acid | 28.21 |
| 4-Dodecylbenzenesultonic acid | 28.29 |
| 4-Tridecylbenzenesulfonic acid | 28.34 |
| 4-Tetra-decylbenzenesulfonic acid | 28.4 |
| 4-Penta-decylbenzenesulfonic acid | 28.46 |
| 4-Hexa-decylbenzenesulfonic acid | 28.51 |

We claim:

1. A composition consisting of an alkylbenzenesulfonic acid having structure (I), wherein n is an integer from 0 to 16;

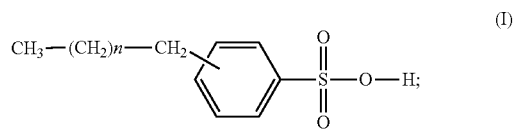

and
a solvent which is either selected from the group consisting of solvents having structures (II), (wherein R is selected from the group consisting of —(—O—CH$_2$—CH$_2$—)$_{n'}$—OH, —OH, and —O—C(=O)—CH$_3$, wherein n' is equal to 1, 2, 3, or 4), a solvent having structure (III), a solvent having structure (IV), and a solvent having structure (V), or a solvent mixture, of at least two solvents selected from this group;

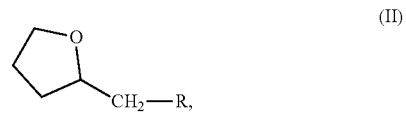

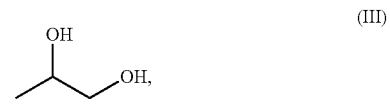

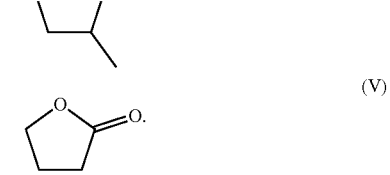

2. A composition consisting of an alkylbenzenesulfonic acid selected having structure (I), wherein n is an integer from 0 to 16;

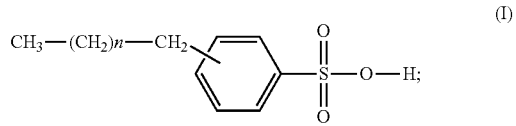

a solvent which is either selected from the group consisting of solvents having structures (II), (wherein R is selected from the group consisting of —(—O—CH$_2$—CH$_2$—)$_{n'}$—OH, —OH, —O—C(=O)—CH$_3$, wherein n' is equal to 1, 2, 3, or 4), a solvent having structure (III), a solvent having structure (IV), and a solvent having structure (V), or a solvent mixture, of at least two solvents selected from this group; and a surfactant.

3. The composition of claim 2, wherein the surfactant is a polymeric surfactant having structure (VIII), wherein n'" is the number of polymer repeat unit and na is the number of CH$_2$ spacer moieties, wherein na is an integer from 8 to 14;

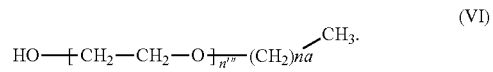

4. The composition of claim 2, wherein for said alkylbenzenesulfonic acid n is an integer from 8 to 16.

5. The composition of claim 2, wherein for said alkylbenzenesulfonic acid n is an integer from 8 to 10.

6. The composition of claim 2, wherein for said alkylbenzenesulfonic acid it has structure (Ia)

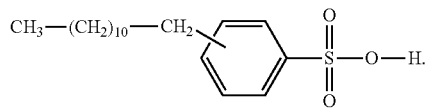

(Ia)

7. The composition of claim 2, wherein for said alkylbenzenesulfonic acid n is an integer from 0 to 10.

8. The composition of claim 2, wherein for said alkylbenzenesulfonic acid n is an integer from 0 to 2.

9. The composition of claim 2, wherein for said alkylbenzenesulfonic acid has structure (Ib);

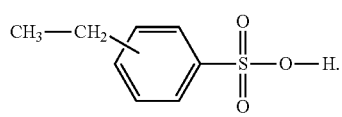

(Ib)

10. The composition of claim 2, wherein said alkylbenzensulfonic acid has structure (Ic), wherein nb is an integer from 0 to 16;

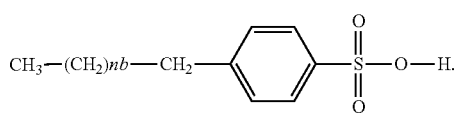

(Ic)

11. The composition of claim 10, wherein nb is an integer from 8 to 10.

12. The composition of claim 10, wherein said alkylbenzenesulfonic acid has structure (Id);

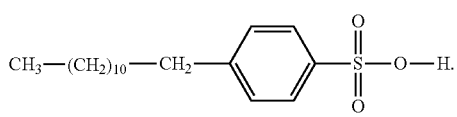

(Id)

13. The composition of claim 10, wherein nb is an integer from 0 to 5.

14. The composition of claim 10, wherein said alkylbenzenesulfonic acid has structure (Ie);

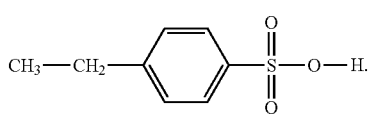

(Ie)

15. The composition of claim 2, wherein said solvent is a single solvent which has a structure falling within the scope of structures (II).

16. The composition of claim 2, wherein said solvent has structure (IIa), wherein n' is 1, 2, 3 or 4;

(IIa)

17. The composition of claim 16, wherein said solvent is a mixture of at least two solvents having structure (IIa) having different values of n' 1, 2, 3, or 4.

18. The composition of claim 2, wherein said solvent has structure (IIf);

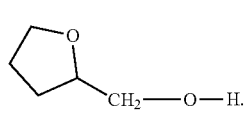

(IIf)

19. The composition of claim 2, wherein said solvent has structure (IIg);

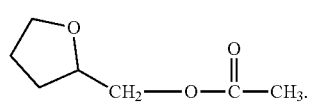

(IIg)

20. The composition of claim 2, wherein said solvent has structure (III);

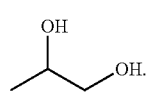

(III)

21. The composition of claim 2, wherein said solvent has structure (IV);

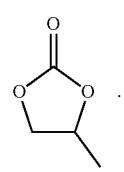

(IV)

22. The composition of claim 2, wherein said solvent has structure (V);

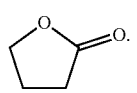

(V)

23. A process comprising the steps;
i) heating the composition of claim 2, at a temperature which is from about room temperature to about 100° C.;

ii) dipping a substrate coated with a patterned photoresist film into said heated composition for a time from about 1 minutes to about 60 minutes, until a dipped substrate with a removed photoresist film, results;

iii) after dipping step ii), rinsing said dipped substrate with a removed photoresist film with either isopropyl alcohol, water or a mixture of isopropyl alcohol and water to remove any residual composition from dipping step ii), producing a clean substrate;

iv) drying said clean substrate, by either spin drying it in air, or by using a stream of nitrogen or air to dry it.

24. A composition consisting essentially of an alkylbenzenesulfonic acid selected having structure (I), wherein n is an integer from 0 to 16;

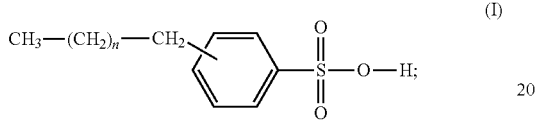
(I)

a solvent which is either selected from the group consisting of solvents having structures (II), (wherein R is selected from the group consisting of —(—O—CH$_2$—CH$_2$—)$_{n'}$—OH, —OH, —O—C(=O)—CH$_3$, wherein n' is equal to 1, 2, 3, or 4), a solvent having structure (III), a solvent having structure (IV), and a solvent having structure (V), or a solvent mixture, of at least two solvents selected from this group; and a surfactant and further wherein said surfactant is a polymeric surfactant having structure (VIII), wherein n''' is the number of polymer repeat unit and na is the number of CH$_2$ spacer moieties, wherein na is an integer from 8 to 14;

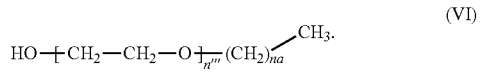
(VI)

* * * * *